(12) United States Patent
Watanabe et al.

(10) Patent No.: US 8,754,631 B2
(45) Date of Patent: Jun. 17, 2014

(54) TEST APPARATUS FOR DIGITAL MODULATED SIGNAL

(75) Inventors: Daisuke Watanabe, Tokyo (JP); Toshiyuki Okayasu, Tokyo (JP)

(73) Assignee: Advantest Corporation, Tokyo (JP)

(*) Notice: Subject to any disclaimer, the term of this patent is extended or adjusted under 35 U.S.C. 154(b) by 408 days.

(21) Appl. No.: 12/991,652

(22) PCT Filed: May 9, 2008

(86) PCT No.: PCT/JP2008/001180
§ 371 (c)(1),
(2), (4) Date: Nov. 8, 2010

(87) PCT Pub. No.: WO2009/136428
PCT Pub. Date: Nov. 12, 2009

(65) Prior Publication Data
US 2011/0057642 A1    Mar. 10, 2011

(51) Int. Cl.
*G01R 23/16*    (2006.01)
(52) U.S. Cl.
USPC .................. 324/76.11; 324/76.12; 324/762.02
(58) Field of Classification Search
None
See application file for complete search history.

(56) References Cited

U.S. PATENT DOCUMENTS

| 6,112,067 | A | * | 8/2000 | Seike et al. ................ 455/226.4 |
| 7,394,277 | B2 | * | 7/2008 | Ishida et al. ............. 324/762.01 |
| 8,269,569 | B2 | * | 9/2012 | Watanabe et al. ............. 332/103 |
| 2011/0054827 | A1 | * | 3/2011 | Ishida et al. .................. 702/125 |

FOREIGN PATENT DOCUMENTS

| JP | 2005-69765 A | 3/2005 |
| JP | 2006-179144 A | 7/2006 |
| WO | 2007/125798 A1 | 11/2007 |

OTHER PUBLICATIONS

PCT International Search Report for PCT Application No. PCT/JP2008/001180 mailed on Jul. 1, 2008, with an English-language translation.
PCT Written Opinion for PCT Application No. PCT/JP2008/001180 mailed on Jul. 1, 2008, with an English-language translation.
PCT International Preliminary Report on Patentability for PCT Application No. PCT/JP2008/001180 mailed on Nov. 18, 2010.

\* cited by examiner

Primary Examiner — Vinh Nguyen
(74) Attorney, Agent, or Firm — Ladas & Parry, LLP

(57) ABSTRACT

An amplitude expected value data generator generates amplitude expected value data that represents, in increments of sampling points, which of multiple amplitude segments the amplitude of a modulated signal waveform that corresponds to the expected value of data to be output from a device under test belongs to. A demodulator performs sampling of the signal waveform to be tested received from the device under test, and generates judgment data that represents, in increments of sampling points, which of the multiple amplitude segments the amplitude of the signal waveform belongs to. A judgment unit makes a comparison between the amplitude expected value data and the judgment data in increments of sampling points.

11 Claims, 13 Drawing Sheets

TEST APPARATUS FOR DIGITAL MODULATED SIGNAL

CROSS REFERENCE TO RELATED APPLICATIONS

This application is the U.S. National Stage of International Patent Application No. PCT/JP2008/001180 filed on May 9, 2008 and claims priority thereto, the disclosure of which is hereby incorporated by reference in its entirety.

BACKGROUND OF THE INVENTION

1. Field of the Invention

The present invention relates to a digital data transmission technique.

2. Description of the Related Art

In conventional digital wired communication, a binary transmission method using time division multiplexing (TDM) has been the mainstream. In this case, high-capacity transmission has been realized by parallel transmission or high-rate transmission. In order to overcome the physical limitations on parallel transmission, serial transmission, which is high-speed transmission, is performed at a data rate of several Gbps to 10 Gbps or more using a high-speed interface (I/F) circuit. However, the data rate acceleration also has a limit, leading to a problem of BER (Bit Error Rate) degradation due to high-frequency loss or reflection in the transmission line.

On the other hand, with the digital wireless communication method, multi-bit information carried by a carrier signal is transmitted and received. That is to say, the data rate is not directly limited by the carrier frequency. For example, in QAM (Quadrature Amplitude Modification), which is the standard quadrature modulation/demodulation method, 4-value transmission is provided using a single channel. Furthermore, 64-QAM provides 64-value transmission using a single carrier. That is to say, such a multi-modulation method raises the transmission capacity without raising the carrier frequency.

Also, such a modulation/demodulation method can also be applied to wired communication in the same way as with wireless communication. Such a modulation/demodulation method has begun to be applied as the PAM (Pulse Amplitude Modulation) method, QPSK (Quadrature Phase Shift Keying) method, or DQPSK (Differential QPSK) method. In particular, in the field of optical communication, from the cost perspective, it is important to increase the information carried by a single optical fiber. This has shifted the technology trend from binary TDM to transmission using such digital modulation.

In the near future, such a digital multi-level modulation/demodulation method has the potential to be applied to a wired interface between devices such as memory, SoC (System On a Chip), etc. However, at the present time, there is no known multi-channel test apparatus which is capable of testing such devices for mass production.

Mixed test apparatuses and RF (Radio Frequency) test modules are known, which test a conventional wireless communication device. However, typical conventional wireless communication devices have a single or several I/O (input/output) communication ports (I/O ports), and thus conventional test apparatuses and test modules include only several communication ports. Accordingly, it is difficult to employ such a test apparatus or a test module to test a device, such as memory, having from tens of to a hundred or more I/O ports.

Furthermore, with the conventional test apparatuses for RF signals, signals output from a DUT (Device Under Test) are A/D (analog/digital) converted, and large amounts of data thus obtained are subjected to signal processing (including software processing) so as to perform expected value judgment. This leads to a long testing time.

Furthermore, digital pins included in conventional test apparatuses are provided, basically assuming that a binary signal (in some cases, a three-value signal further including the high-impedance state (Hi-Z)) is to be tested. That is to say, conventional test apparatuses including such digital pins have no demodulation function for a digitally modulated signal.

In a case in which all the I/O ports of a device such as memory, MPU (Micro Processing Unit), etc., are configured using the digital multi-level modulation method, such a single device has from tens of to a hundred or more I/O ports. Accordingly, there is a need to test such hundreds of I/O ports at the same time. That is to say, there is a need to provide a test apparatus having thousands of input/output channels for digitally modulated/demodulated signals. Furthermore, real-time testing at the hardware level is required in all steps due to the CPU resource limits of the test apparatus.

SUMMARY OF THE INVENTION

The present invention has been made in view of such a situation. Accordingly, it is an exemplary purpose of the present invention to provide a test apparatus having a digital multi-level modulation function or a digital multi-level demodulation function.

An embodiment of the present invention relates to a test apparatus configured to test a signal to be tested, which has been subjected to digital multi-level modulation, output from a device under test. The test apparatus comprises: an amplitude expected value data generator configured to generate amplitude expected value data that represents, in increments of sampling points, which of multiple amplitude segments the amplitude of a modulated signal waveform that corresponds to the expected value of data to be output from the device under test belongs to; a demodulator configured to perform sampling of the waveform of the signal to be tested output from the device under test, and to generate judgment data that represents, in increments of sampling points, which of the multiple amplitude segments the amplitude of the signal waveform to be tested belongs to; and a judgment unit configured to make a comparison between the amplitude expected value data and the judgment data in increments of sampling points.

Also, the amplitude expected value data generator may comprise: an expected value pattern generator configured to generate an expected value pattern that represents the expected value of data to be output from the device under test; and an encoding circuit configured to encode the expected value pattern to amplitude expected value data that represents, in increments of sampling points, which of multiple amplitude segments the amplitude of the corresponding modulated signal waveform belongs to.

Also, the demodulator may comprise: a multi-level comparator configured to compare the signal to be tested with multiple threshold values that correspond to the respective amplitude segments so as to generate multiple judgment data; and a latch array configured to latch the multiple judgment data output from the multi-level comparator at predetermined sampling timings.

Also, the demodulator may further comprise a retiming processing unit configured to synchronize the multiple judgment data latched by the latch array with the amplitude value expected data in increments of sampling points.

Also, the amplitude expected value data generator may comprise: an expected value pattern generator configured to generate an expected value pattern that represents the expected value of data to be output from the device under test; and an encoding circuit configured to encode the expected value pattern to amplitude expected value data that represents, in increments of sampling points, which of multiple amplitude segments the amplitude of the corresponding modulated signal waveform belongs to, and to output timing data that represents time intervals between the sampling points. Also, the demodulator may comprise: a multi-level comparator configured to compare the signal to be tested with multiple threshold values that correspond to the respective amplitude segments so as to generate the multiple judgment data; and a latch array configured to latch the multiple judgment data output from the multi-level comparator at sampling timings that correspond to the value of the timing data.

Also, the test apparatus may further comprise a timing generator configured to receive the timing data, and to generate a first pulse edge sequence having intervals that correspond to the timing data thus received. Also, the latch array may latch each judgment data using the first pulse edge sequence received from the timing generator.

Also, the timing generator may be configured such that the frequency of the first pulse edge sequence and the timing of each edge are adjustable as desired.

Also, the amplitude expected value data generator may comprise: an expected value pattern generator configured to generate an expected value pattern that represents the expected value of data to be output from the device under test; and an encoding circuit configured to encode the expected value pattern to expected value data that represents, in increments of sampling points, which of multiple amplitude segments the amplitude of the corresponding modulated signal waveform belongs to, and to output rate setting data that represents the rate of the amplitude expected value data. Also, the demodulator may comprise: a multi-level comparator configured to compare the signal to be tested with multiple threshold values that correspond to the respective amplitude segments so as to generate the multiple judgment data; a latch array configured to latch the multiple judgment data output from the multi-level comparator at predetermined sampling timings; and a retiming processing unit configured to latch the multiple judgment data latched by the latch array at timings that correspond to the rate setting data, such that the aforementioned multiple judgment data latched by the latch array are synchronized with the amplitude expected value data in increments of sampling points.

Also, the test apparatus may further comprise a timing generator configured to receive the rate setting data, and to generate a second pulse edge sequence having a frequency that corresponds to the rate setting data. Also, the retiming processing unit may be configured to synchronize the multiple judgment data received from the latch array with the second pulse edge sequence.

Also, the multi-level comparator may be configured such that the threshold level thereof is adjustable.

By configuring the multi-level comparator such that the threshold level thereof is adjustable, such an arrangement supports various kinds of digital multi-level modulation methods. Alternatively, such an arrangement is capable of emulating a device which receives data from the device under test.

Another embodiment of the present invention relates to a test method for testing a signal to be tested, which has been subjected to digital multi-level modulation, output from a device under test. The test method comprises: generating amplitude expected value data that represents, in increments of sampling points, which of multiple amplitude segments the amplitude of a modulated signal waveform that corresponds to the expected value of data to be output from the device under test belongs to; sampling a signal to be tested that corresponds to data output from the device under test, and generating judgment data that represents, in increments of sampling points, which of the multiple amplitude segments the amplitude of the signal waveform to be tested belongs to; and comparing the amplitude expected value data with the judgment data in increments of sampling points.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
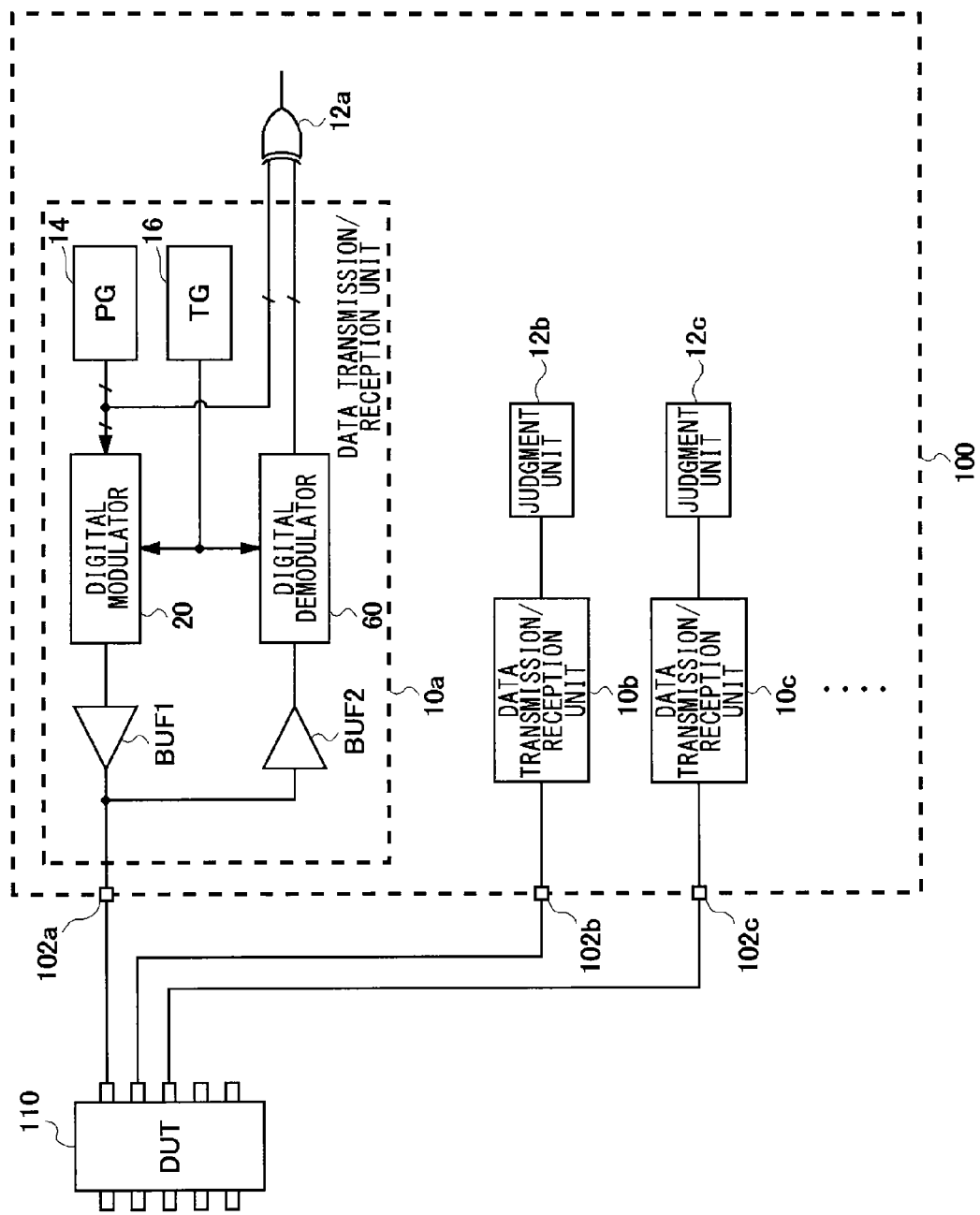
FIG. 1 is a block diagram which shows an overall configuration of a test apparatus according to an embodiment of the present invention.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

The test target to be tested by a test apparatus according to an embodiment is a device under test (DUT) including a transmission/reception interface for digital multi-level modulated data (which will simply be referred to as the "digitally modulated data" hereafter). That is to say, a pattern signal is digitally modulated, and the pattern signal thus digitally modulated is supplied to the DUT. Furthermore, the digitally modulated data output from the DUT is compared with an expected value so as to perform quality judgment. The test apparatus may include a waveform analysis function for the data thus digitally modulated, a function of generating a constellation map, etc., in addition to the quality judgment function.

Digital modulation includes APSK (amplitude phase shift keying), QAM (quadrature amplitude modulation), QPSK (quadrature phase shift keying), and BPSK (binary phase shift keying), etc. The DUT is assumed to be a device having a multi-channel I/O port such as memory or MPU. However, the DUT is not restricted in particular.

FIG. 1 is a block diagram which shows an overall configuration of a test apparatus 100 according to an embodiment of the present invention. The test apparatus 100 shown in FIG. 1 includes multiple I/O terminals 102a, 102b, 102c, and so forth, in increments of I/O ports of the DUT. The number of I/O ports is not restricted in particular. With memory or an MPU, tens of to a hundred or more I/O ports are provided. The multiple I/O ports 102 of the test apparatus 100 are connected to the respective I/O ports of the DUT 110 via a transmission path.

The test apparatus 100 includes multiple data transmission/reception units 10a, 10b, 10c, and so forth, and judgment units 12a, 12b, 12c, and so forth, provided to the multiple respective I/O terminals 102a, 102b, 102c, and so forth. The multiple data transmission/reception units 10 have the same configuration, and the multiple judgment units 12 have the same configuration. Thus, only the configurations of the data transmission/reception unit 10a and the judgment unit 12b are shown in detail.

Each data transmission/reception unit 10 has: a function of digitally modulating a carrier signal (carrier wave) with pattern data to be supplied to the DUT 110 as the modulation signal, and outputting the resulting signal to the corresponding I/O port of the DUT 110; and a function of receiving modulated data output from the DUT 110, and demodulating the modulated data thus received. The demodulated data is compared with an expected value so as to judge the quality of the DUT 110.

The data transmission/reception unit 10 includes a pattern generator 14, a timing generator 16, an output buffer BUF1, an input buffer BUF2, a digital modulator 20, and a digital demodulator 60.

The pattern generator 14 generates a test pattern to be supplied to the DUT 110. The number of bits of each test pattern data (which will also be referred to as the "pattern data") corresponds to the digital modulation/demodulation format employed in data transmission between the DUT 110 and the test apparatus 100. For example, in the case of 16-QAM, the data are each configured as 4-bit data, and in the case of 64-QAM, the data are each configured as 6-bit data. In the case of QPSK, the data are each configured as 2-bit data, and in the case of BPSK, the data are each configured as 1-bit data. Description will be made below regarding an arrangement employing 16-QAM for ease of understanding. That is to say, the pattern generator 14 generates 4-bit pattern data.

The timing generator 16 generates a timing signal, and outputs the timing signal thus generated to the digital modulator 20. The timing generator 16 is capable of finely adjusting (e.g., on the order of several ps to several ns) the phase of the timing signal in increments of cycles of the pattern data. Known circuits employed in test apparatuses used to test a conventional system configured to perform binary transmission can be used as the timing generator 16 and the pattern generator 14.

The digital modulator 20 generates a modulated signal which has been subjected to quadrature amplitude modulation (e.g., 16-QAM) according to the pattern data, and outputs the resulting signal as a test signal. The test signal is output to the DUT 110 via the output buffer BUF1.

The input buffer BUF2 receives a test target signal output from the DUT 110, and outputs the test target signal thus received to the digital demodulator 60. The digital demodulator 60 demodulates the modulated data thus received so as to extract digital data. The judgment unit 12a compares the data thus demodulated by the digital demodulator 60 with expected value data output from the pattern generator 14. The output buffer BUF1 and the input buffer BUF2 may each be configured as a two-way buffer.

The above is the overall schematic configuration and operation of the test apparatus 100. As described above, the test apparatus 100 is required to process tens of to a hundred or more items of data, and includes data transmission/reception units 10 in increments of input/output ports. Accordingly, there is a need to design the data transmission/reception unit 10 such that it can be integrated on a semiconductor substrate using the CMOS process or other processes.

Description will be made regarding the digital modulator 20 as a first embodiment, and the digital demodulator 60 as a second embodiment.

First Embodiment

Figure 2:
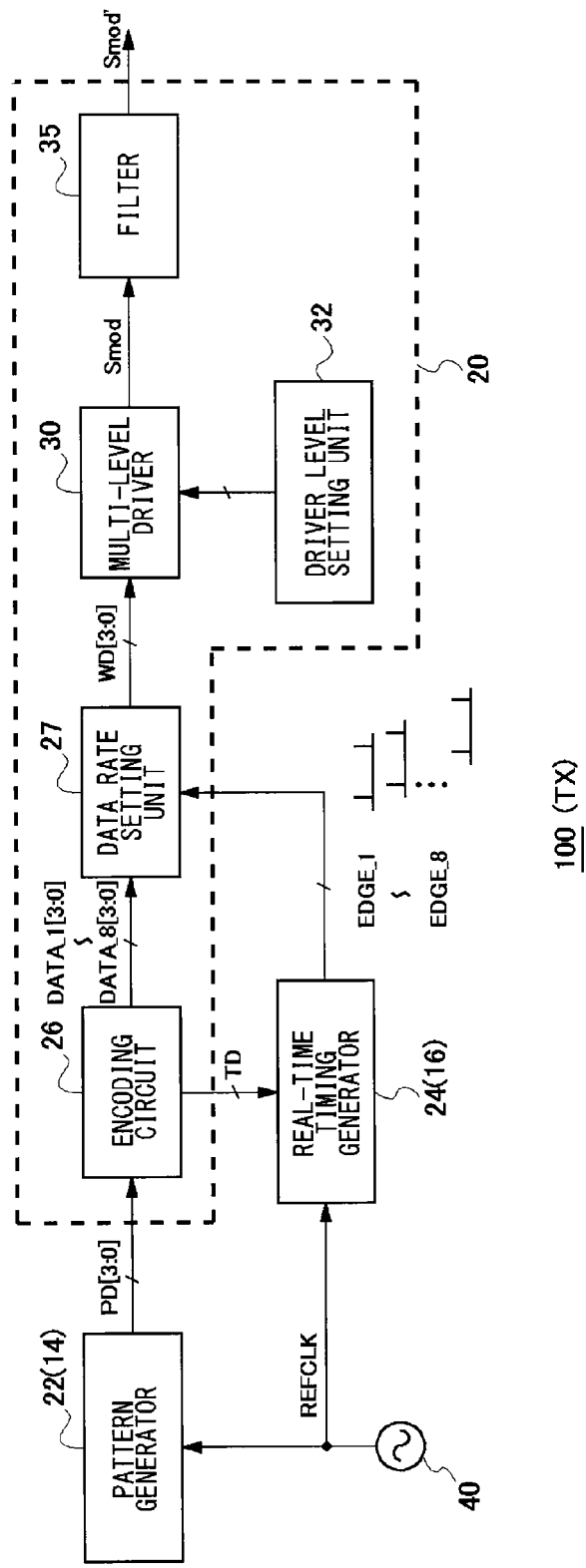
FIG. 2 is a block diagram which shows a configuration of a transmission circuit including a digital modulator according to an embodiment.

FIG. 2 is a block diagram which shows a configuration of a transmission circuit including the digital modulator 20 according to an embodiment. The transmission circuit included in the test apparatus 100 includes a digital modulator 20, a pattern generator 22, a real-time timing generator (which will simply be referred to as the "timing generator" hereafter) 24, and a reference signal source 40. The pattern generator 22 corresponds to the pattern generator 14 shown in FIG. 1, and the timing generator 24 corresponds to the timing generator 16 shown in FIG. 1.

The reference signal source 40 generates a reference clock REFCLK. The pattern generator 22 generates pattern data PD[3:0], having a frequency that corresponds to the reference clock REFCLK, to be supplied to the DUT 110. The number of bits of the signal line shown in FIG. 2 corresponds to the number of bits used in an arrangement employing 16-QAM. However, the present invention is not restricted to such an arrangement employing such a number of bits. The digital modulator 20 generates modulated signal waveform according to the symbol of the pattern data PD[3:0].

Figure 3:
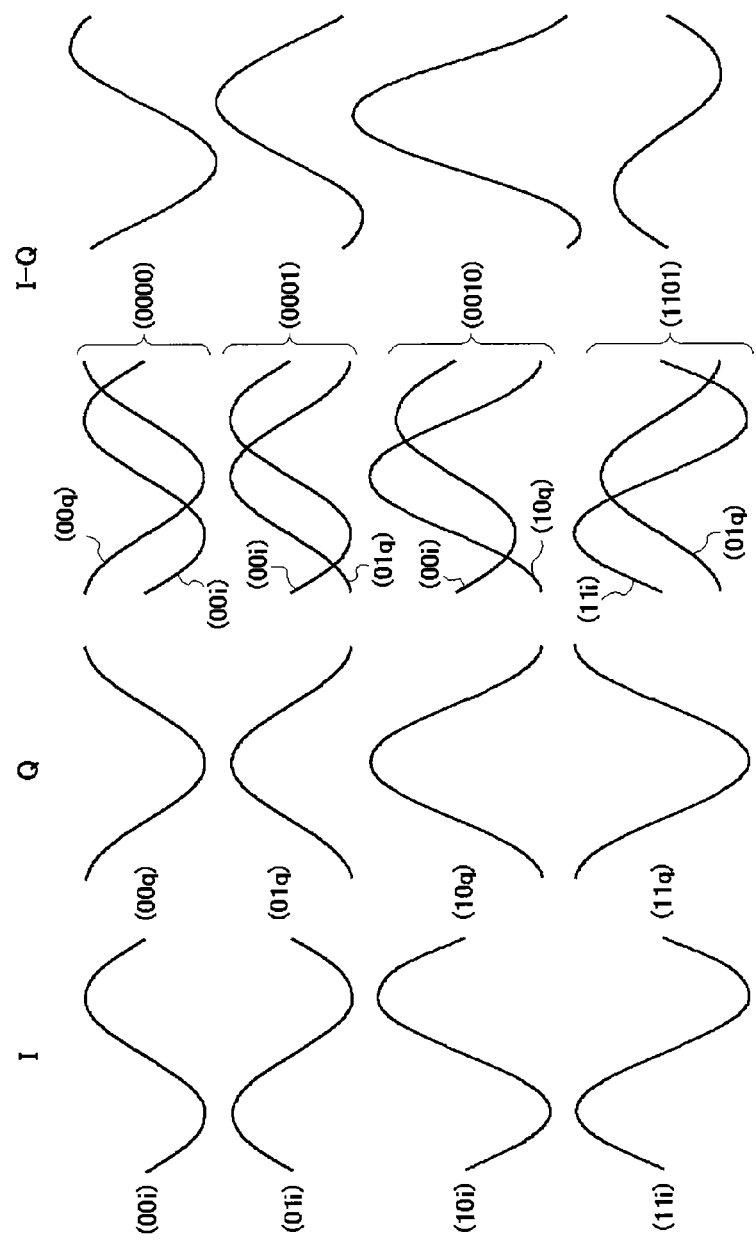
FIG. 3 is a diagram which shows a modulated signal waveform that corresponds to each symbol in a case in which 16-QAM is employed.

FIG. 3 is a diagram which shows the demodulated signal waveforms that correspond to the respective symbols employed in such a case of 16-QAM. The data of the in-phase component I is set to any of the values (00), (01), (10), or (11), and each respective waveform is represented by any of cos ωt, −cos ωt, 2 cos ωt, or −2 cos ωt. Similarly, the data of the quadrature component Q is set to any of (00), (01), (10), or (11), and each respective waveform is represented by any of sin ωt, −sin ωt, 2 sin ωt, or −2 sin ωt. The correspondence relation between the data and the waveform is determined according to the encoding format. A modulated signal in 16-QAM is obtained by summing the in-phase component I and the quadrature component Q. That is to say, 16 (=4×4) waveforms are defined according to the combination of the I-Q data. FIG. 3 shows four combined waveforms (modulated signal waveforms) that correspond to four symbols (0000), (0001), (0010), and (1101).

Figure 4:
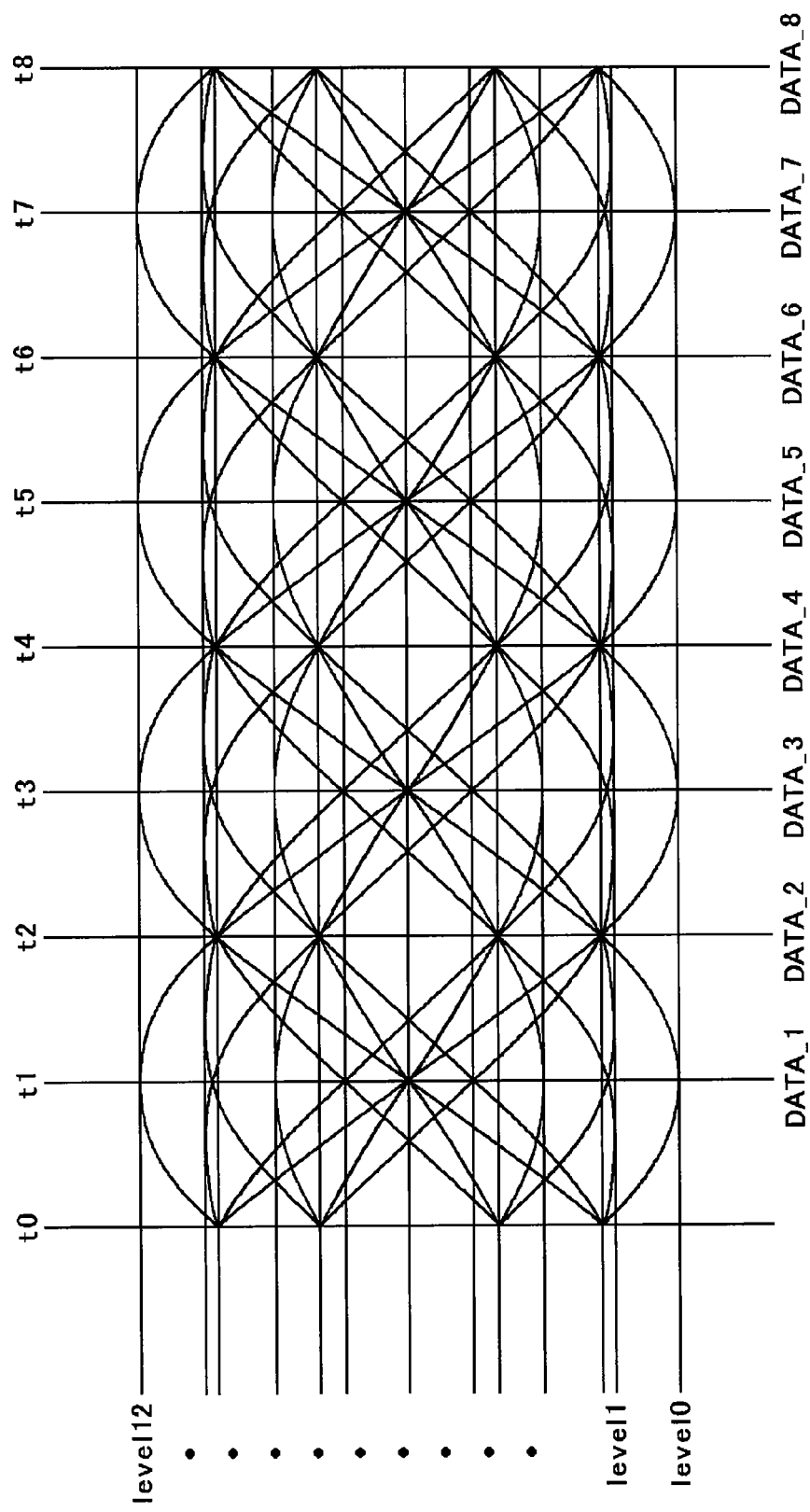
FIG. 4 is a diagram which shows a quantization rule for a modulated signal in a case in which 16QAM is employed.

The modulated signal waveform that corresponds to each symbol is quantized according to a predetermined rule. FIG. 4 is a diagram which shows a quantization rule for quantizing the modulated signal in a case of 16-QAM. FIG. 4 shows an eye diagram of modulated signal waveforms used in 16-QAM. The sixteen symbols are each represented by a linear sum of trigonometric functions, and accordingly, each symbol is also represented by a trigonometric function. The waveform of the modulated signal is quantized at k levels in the level direction (amplitude direction) at a sampling rate that is n (n is an integer) times the symbol rate. FIG. 4 shows an arrangement in which n=8 and k=13. In a case in which k=13, the data of each sampling point can be represented by four bits or less.

The present invention is not restricted to an arrangement in which the levels of the quantization threshold values in the amplitude direction are set at regular intervals. As shown in FIG. 4, each quantization threshold level may be set at a corresponding crossing point at which an anticipated eye pattern crosses the sampling point (sampling timing). Although the eye pattern appears complicated at first sight, the curves in the eye pattern each represent trigonometric functions having different amplitudes and different phases. With quadrature modulation, the signal is the sum of trigonometric functions having phases shifted by 90 degrees, and to that extent such an arrangement does not require a high number of level setting points, i.e., a high resolution. From the circuit scale perspective, a resolution (number of level setting points) in the amplitude direction of, at the most, six bits (i.e., k≤32) is preferably employed.

Returning to FIG. 2, the digital modulator 20 includes an encoding circuit 26, a data rate setting unit 27, a multi-level driver 30, a driver level control unit 32, and a filter 35.

The encoding circuit 26 receives pattern data PD[3:0]. The encoding circuit 26 operates in cycles having a predetermined period Tp. The predetermined period Tp is preferably set to be the same as the symbol period. Also, the predetermined period Tp may be half or double the symbol period. The encoding circuit 26 generates, in parallel, data (amplitude data) DATA_1[m:0] through DATA_n[m:0] which represent the amplitudes of the respective sampling points set for the modulated signal waveform that corresponds to the pattern data PD[3:0].

The integer m is set according to the amplitude resolution of the sampling waveform. For example, in a case in which the sampling waveform is quantized at thirteen levels in the amplitude direction, four-bit amplitude data DATA[3:0] is generated. Furthermore, the integer n represents the number of sampling points in the time axis direction in the predetermined period Tp. That is to say, in a case in which the predetermined period Tp includes eight sampling points (sampling timings) t1 through t8, the amplitude data DATA_1[3:0] through DATA_8[3:0] to be provided in increments of sampling timings t1 through t8 are simultaneously generated in a parallel manner.

The data rate setting unit 27 receives multiple amplitude data DATA_1 through DATA_8 generated by the encoding circuit 26 at respective sampling timings t1 through t8. The data rate setting unit 27 latches the amplitude data DATA_1 through DATA_8 at the respective sampling timings, and sequentially outputs the data thus latched. That is to say, the eight data units, which are input in a parallel manner at a symbol rate in increments of the predetermined period Tp, are output in the form of serial data. The output data thus output from the data rate setting unit 27 will be referred to as waveform data WD[3:0].

The encoding circuit 26 outputs timing data TD which represents the time intervals between the sampling points, together with the amplitude data DATA_1 through DATA_8. The timing generator 24 generates multiple pulse edge sequences EDGE_1 through EDGE_8 that represent the multiple sampling timings t1 through t8. The timing generator 24 is configured such that the frequencies of each of the pulse edge sequences EDGE_1 through EDGE_8, and the timings of each edge, are configurable as desired. The multiple pulse edge sequences EDGE_1 through EDGE_8 are each generated for cycles of the predetermined period Tp. Furthermore, the i-th pulse edge sequence EDGE_i has a phase delay that corresponds to the timing data TD with respect to the (i−1)-th pulse edge sequence EDGE_(i−1).

The data rate setting unit 27 may include: a latch array (not shown) configured to latch the amplitude data DATA_1 through DATA_8 using the pulse edge sequences EDGE_1 through EDGE_8; and a parallel/serial conversion unit (not shown) configured to perform serial conversion of the amplitude data OUT_DATA_1 through OUT_DATA_8 output from the latch array in a parallel manner. Thus, the data rate setting unit 27 generate the waveform data WD[3:0] in the form of serial data.

The multi-level driver 30 receives the waveform data WD[3:0] sequentially output from the data rate setting unit 27 in increments of sampling timings t1 through t8. The multi-level driver 30 generates a test signal having a signal level (e.g., voltage value) that corresponds to the value of the waveform data WD[3:0]. The relation between the value of the waveform data WD and the signal level is set according to the quantization rule shown in FIG. 4.

Figure 5:
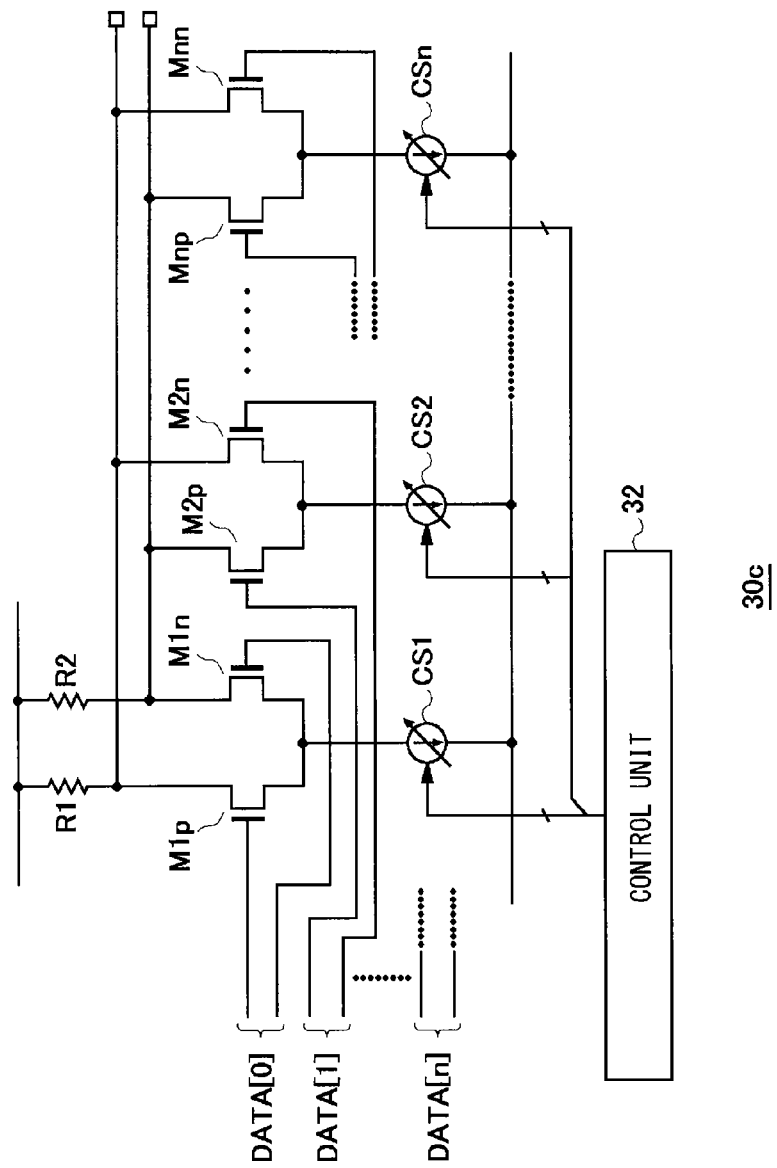
FIG. 5 is a circuit diagram which shows an example configuration of a multi-level driver.

The multi-level driver 30 is preferably configured such that the relation between the signal level and the value of the waveform data can be adjusted as desired. FIG. 5 is a circuit diagram which shows an example configuration of the multi-level driver 30. The multi-level driver 30 includes multiple differential amplifiers. An M-level driver receives n (here, the relation $M=2^n$ is satisfied) input data DATA as differential signals. The data DATA[0:n] shown in FIG. 5 corresponds to the waveform data WD[0:3] shown in FIG. 2.

The multiple differential amplifiers are connected in parallel such that output load circuits R1 and R2 are shared. Instead of the resistor loads R1 and R2, a current mirror circuit may be provided as an output load circuit. The i-th differential amplifier includes a differential pair Mip and Min, a tail current source CSi, and load resistors R1 and R2. The drains of the multiple transistors that form the differential pairs are connected such that they form common drains. The signals output from the common drains thus connected are output as a differential signal to a downstream circuit. It should be noted that the multi-level driver may be configured as a single-ended circuit. Also, the multi-level driver may be configured using P-channel MOSFETs. That is to say, the multi-level driver may be configured as an appropriate known circuit as desired.

Tail current sources CS1 through CSn are each configured as a current D/A converter. That is to say, each of the tail current sources CS1 through CSn supplies, to a corresponding differential pair, a tail current (bias current) that corresponds to the input control signal. By changing the tail currents thus generated by the tail current sources CS1 through CSn, such an arrangement is capable of adjusting the output level of the multi-level driver 30c as desired. The driver level control unit 32 digitally controls the values of the tail current sources CS1 through CSn. That is to say, the driver level control unit 32 and the tail current sources CS1 through CSn form a current D/A driver. Also, a D/A converter can be employed as such a multi-level driver.

Returning to FIG. 2, the modulated signal Smod output from the multi-level driver 30 is configured as an analog signal having a discretely-set amplitude value (level). By removing the frequency components other than the carrier frequency band from the analog signal, such an arrangement generates the modulated signal Smod' which is to be obtained. Thus, a filter 35 configured to perform filtering of the modulated signal Smod is arranged as a downstream component of the multi-level driver 30. The filter 35 may be configured as a low-pass filter, Thomson filter, or the like. The cutoff frequency of the filter 35 is set based upon the carrier frequency of the modulated signal Smod.

It should be noted that, in a case in which a parasitic filter is formed at the output terminal of the multi-level driver 30 due to wiring, parasitic capacitance, and so forth, the parasitic filter thus formed may be actively employed, thereby supplying the output signal of the multi-level driver 30 to the DUT 110 as a test signal.

The above is the configuration of the test apparatus 100. Next, description will be made regarding the operation of the test apparatus 100.

Figure 6:
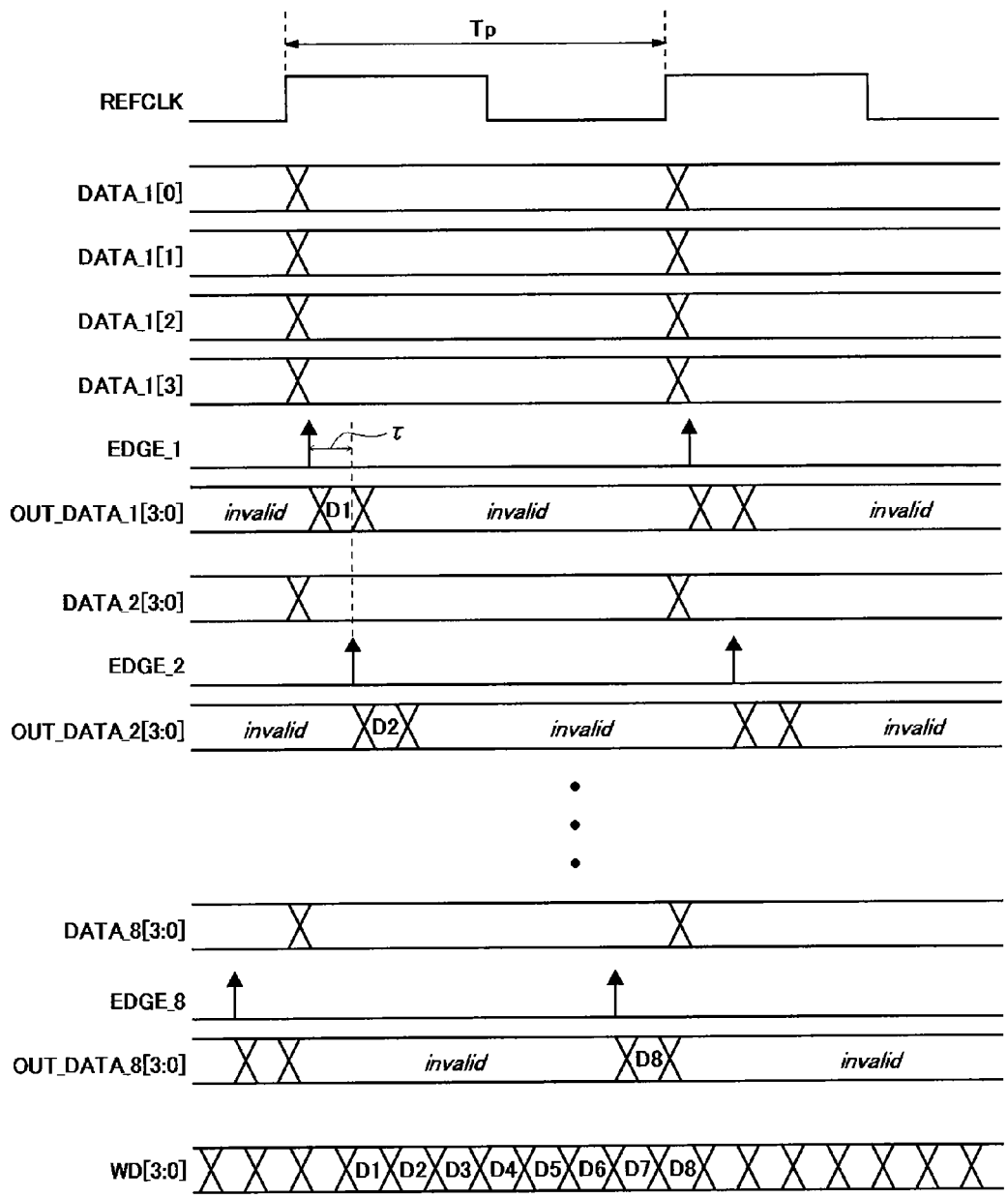
FIG. 6 is a time chart which shows the operation state of the test apparatus according to an embodiment.

FIG. 6 is a time chart which shows the operation states of the test apparatus 100 according to an embodiment. The time charts shown in FIG. 6 shows the reference clock REFCLK, the amplitude data DATA_1[3:0] through DATA_n[3:0], OUT_DATA_1[3:0] through OUT_DATA_n[3:0], the pulse edge sequences EDGE_1 through EDGE_8, and the waveform data WD[3:0].

The pattern generator 22 and the encoding circuit 26 operate within the frequency domain of the reference clock REFCLK, and generate the pattern data PD[3:0] in increments of predetermined edges of the reference clock REFCLK. The encoding circuit 26 receives the pattern data PD[3:0], and encodes the pattern data PD[3:0] in increments of sampling points t1 through t8 so as to generate four-bit amplitude data DATA_1 through DATA_8.

The timing generator 24 generates, synchronously with the reference clock REFCLK, the multiple pulse edge sequences EDGE_1 through EDGE_8 having phase delays τ that correspond to the value of the timing data TD. The phase delay τ corresponds to the time interval between the sampling points. The data rate setting unit 27 latches each of the amplitude data DATA_1 through DATA_8 using the corresponding pulse edge sequence EDGE_1 through EDGE_8. The amplitude data OUT_DATA_1 through OUT_DATA_8 are converted into the waveform data WD[3:0] in the form of serial data.

Figure 7:
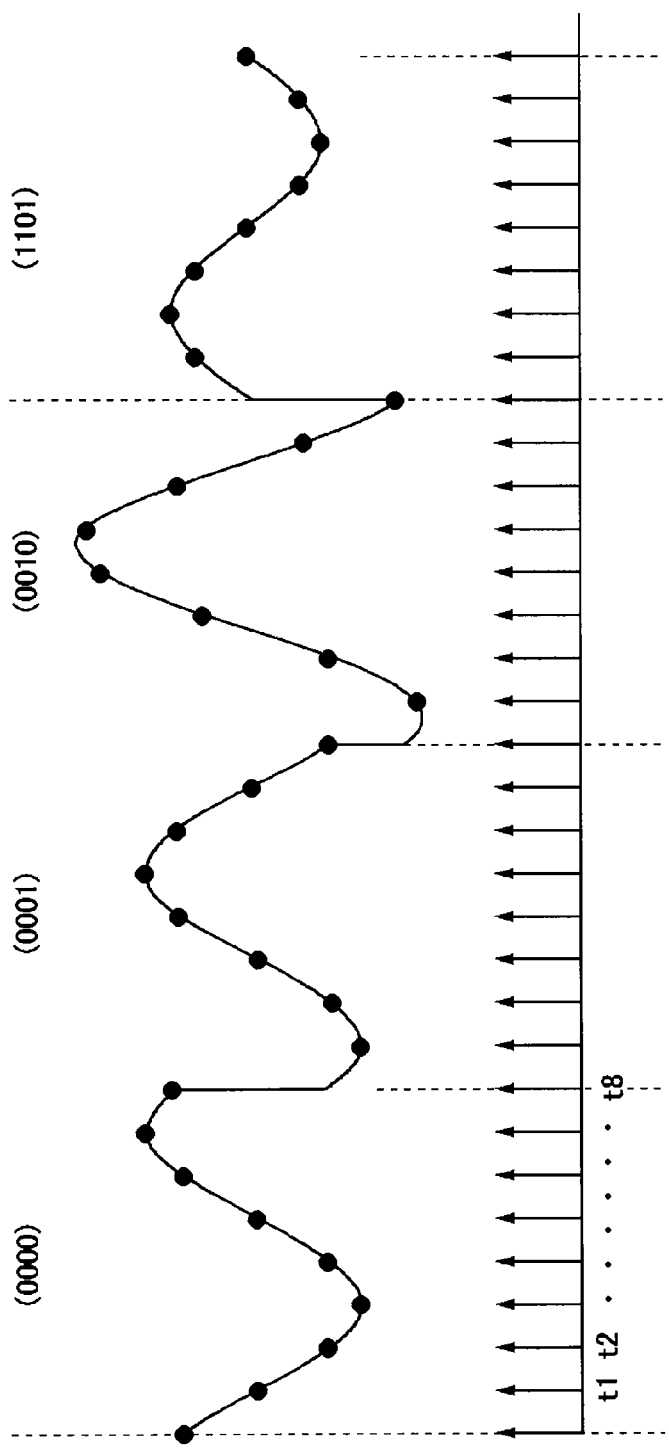
FIG. 7 is a diagram which shows the waveform of a modulated signal generated by the test apparatus according to an embodiment.

FIG. 7 is a diagram which shows the waveform of the modulated signal Smod generated by the test apparatus 100 according to an embodiment. FIG. 7 shows a modulated signal waveform that corresponds to the symbols (0000), (0001), (0010), and (1101), in a case in which the quantization rule for 16-QAM is employed.

Description has been made regarding the configuration and operation of the test apparatus 100 including the digital modulator 20 according to the embodiment. The digital modulator 20 according to such an embodiment is capable of generating test data modulated according to the 16-QAM format or various similar modulation formats, while being configurable as a simple circuit.

Figure 8:
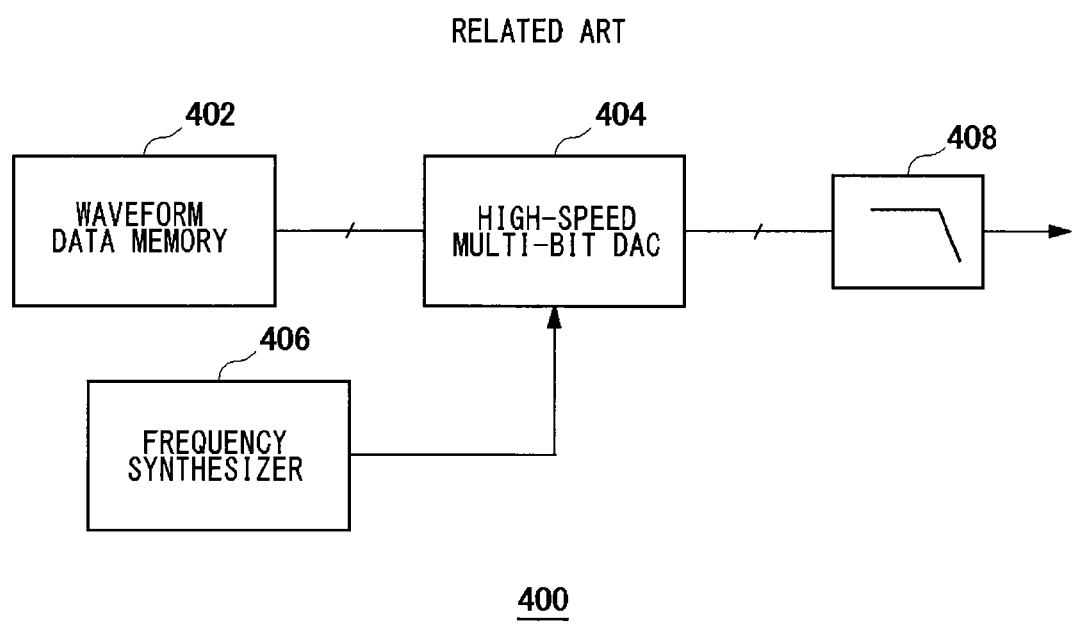
FIG. 8 is a block diagram which shows a configuration of a test apparatus according to related art.

The advantages and superior effectiveness of the test apparatus 100 as compared with conventional techniques can be clearly understood in comparison with a test apparatus employing a conventional architecture. FIG. 8 is a test apparatus 400 according to the related art. The test apparatus 400 is configured as an arbitrary waveform generator.

The test apparatus 400 includes waveform data memory 402, a D/A converter 404, a frequency synthesizer 406, and a filter 408. The waveform data memory 402 stores, in the form of digital values, the waveforms to be supplied to the DUT 110. The D/A converter 404 sequentially converts, into an analog signal, the digital values read from the waveform data memory. The operation frequency of the D/A converter is controlled by the frequency synthesizer 406. The filter 408 performs filtering of the output signal of the D/A converter 404.

That is to say, if a test apparatus having the same functions as described above is configured using such a conventional architecture, there is a need to generate 16-QAM digital data by means of a DSP (Digital Signal Processor), or to store the 16-QAM digital data in the waveform data memory. Furthermore, there is a need to convert the 16-QAM digital data into an analog voltage by means of a D/A converter. Moreover, with such a test apparatus, a modulated signal must be generated for each port of the DUT 110. However, if such a DSP is provided to each port, there is a need to provide enormous resources. Accordingly, such an arrangement does not serve any practical purpose. Furthermore, in a case in which GHz-band frequency is employed as the carrier frequency, such an arrangement requires D/A converters configured to perform an extremely high-speed operation, which is also a problem.

In a case of employing waveform data memory instead of the DSPs, there is a need for at least 8-bit quantization of the modulated signal waveform, and preferably 10-bit or higher quantization. Furthermore, such an arrangement requires that the number of waveform data units be equal to the number of symbols. Accordingly, such an arrangement requires an enormous memory area. Moreover, there is a need to design the D/A converter 404 such that it operates at a high speed of several GHz with high precision. From such a perspective, it does not serve any practical purpose to apply such a configuration to each of the multi-channel I/O ports included in memory or an MPU.

In contrast, the test apparatus 100 according to the embodiment only requires at least 16-level or 32-level resolution. This corresponds to only 4-bit or 5-bit precision in the D/A converter. Instead, eight or more sampling points are provided for each cycle of the carrier frequency or within each symbol time, thus raising the time-axis resolution.

As a result, such an arrangement provides a test apparatus having an extremely simple configuration. Alternatively, such an arrangement reduces power consumption of the test apparatus. In a case in which the DUT 110 to be tested has multi-channel I/O ports, such a technique allows a digital modulator 20 shown in FIG. 2 to be provided for every pin. Also, using the CMOS process, such digital modulators provided for hundreds of channels can be easily integrated on a single semiconductor substrate or on multiple semiconductor substrates. Thus, such an arrangement is capable of supplying test data to multiple I/O ports of the DUT 110 at a high speed in a parallel manner.

Description has been made regarding an arrangement employing 16-QAM. Also, the circuit shown in FIG. 2 is capable of generating modulated data in various formats such as QPSK, BPSK, offset QPSK, DPSK, shift PSK, etc. With such an arrangement the operation of the encoding circuit 26 should be changed according to the modulation method.

Next, description will be made regarding a modification of the digital modulator 20.

Description has been made in the embodiment regarding an arrangement in which the predetermined period Tp is equal to the time of one symbol. However, the present invention is not restricted to such an arrangement. For example, the encoding circuit 26 may divide the time of one symbol into several time units, and may use the time units thus obtained as the predetermined period Tp to generate the amplitude data DATA_1 through DATA_n. That is to say, the predetermined period Tp may be set to a value obtained by dividing the symbol time by an integer.

Conversely, the encoding circuit 26 may use the time for multiple symbols as the predetermined period Tp to generate the amplitude data DATA_1 through DATA_n. That is to say, the predetermined period Tp may be set to a value obtained by multiplying the symbol time by an integer.

Description has been made in the embodiment regarding an arrangement in which the carrier frequency is equal to the symbol rate. Also, the carrier frequency may be set to a value obtained by multiplying the symbol rate by an integer.

Seen from a different point of view, although description has been made in the embodiment regarding an arrangement in which the predetermined period Tp is equal to the period of the carrier signal, the predetermined period Tp may also be set to a value obtained by multiplying or dividing the period of the carrier signal by an integer. It should be noted that, in a case in which the predetermined period Tp is equal to an integral multiple of the period of the carrier signal, the same modulated signal waveform is repeatedly generated within the predetermined period Tp. Thus, the amplitude data DATA_1 through DATA_n may be repeatedly generated and used for each period of the carrier signal.

Figure 9:
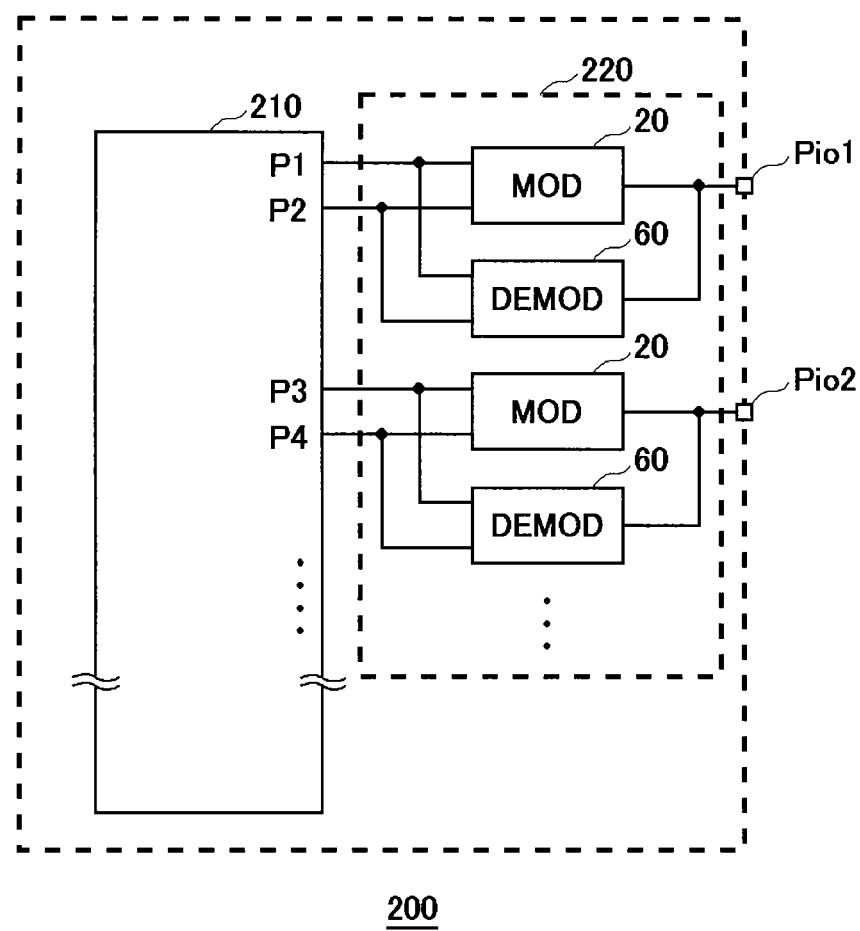
FIG. 9 is a block diagram which shows a configuration of a semiconductor apparatus including a digital modulator according to an embodiment.

Description has been made in the embodiment regarding an arrangement in which the digital modulator 20 shown in FIG. 2 is mounted on the test apparatus 100. Also, the digital modulator 20 may be mounted as an interface of a semiconductor apparatus. FIG. 9 is a block diagram which shows a configuration of a semiconductor apparatus 200 including the digital modulator 20 according to the embodiment.

The semiconductor apparatus 200 includes, as internal components, a function device 210, multiple digital modulators 20, and multiple digital demodulators 60. The semiconductor apparatus 200 further includes input/output pins Pio1, Pio2, and so on, which allow the semiconductor apparatus 200 to perform signal transmission with an external circuit. The function device 210 is configured as memory, an MPU, or the like. The function device 210 includes multiple input/output ports P1, P2, P3, P4, and so on, and is configured to input and output binary data via the ports.

Pairs of the digital modulator 20 and the digital demodulator 60 are provided in increments of input/output port sets, each comprising a given number of input/output ports. In FIG. 9, these pairs are provided in increments of input/output port sets comprising two input/output ports. Each digital modulator 20 digitally modulates the data output from the multiple input/output ports of the function device 210, and outputs the digitally modulated data to an external circuit. Furthermore, each digital demodulator 60 demodulates the data input from an external circuit, and outputs the data thus input to the corresponding port of the function device 210.

With an embodiment, the multiple digital modulators 20 and the multiple digital demodulators 60 may be integrated in the function device 210.

With another embodiment, the multiple digital modulators 20 and the multiple digital demodulators 60 may be integrated as an interface module 220 (I/O module) on a semiconductor substrate separate from that of the function device 210.

Second Embodiment

Figure 10:
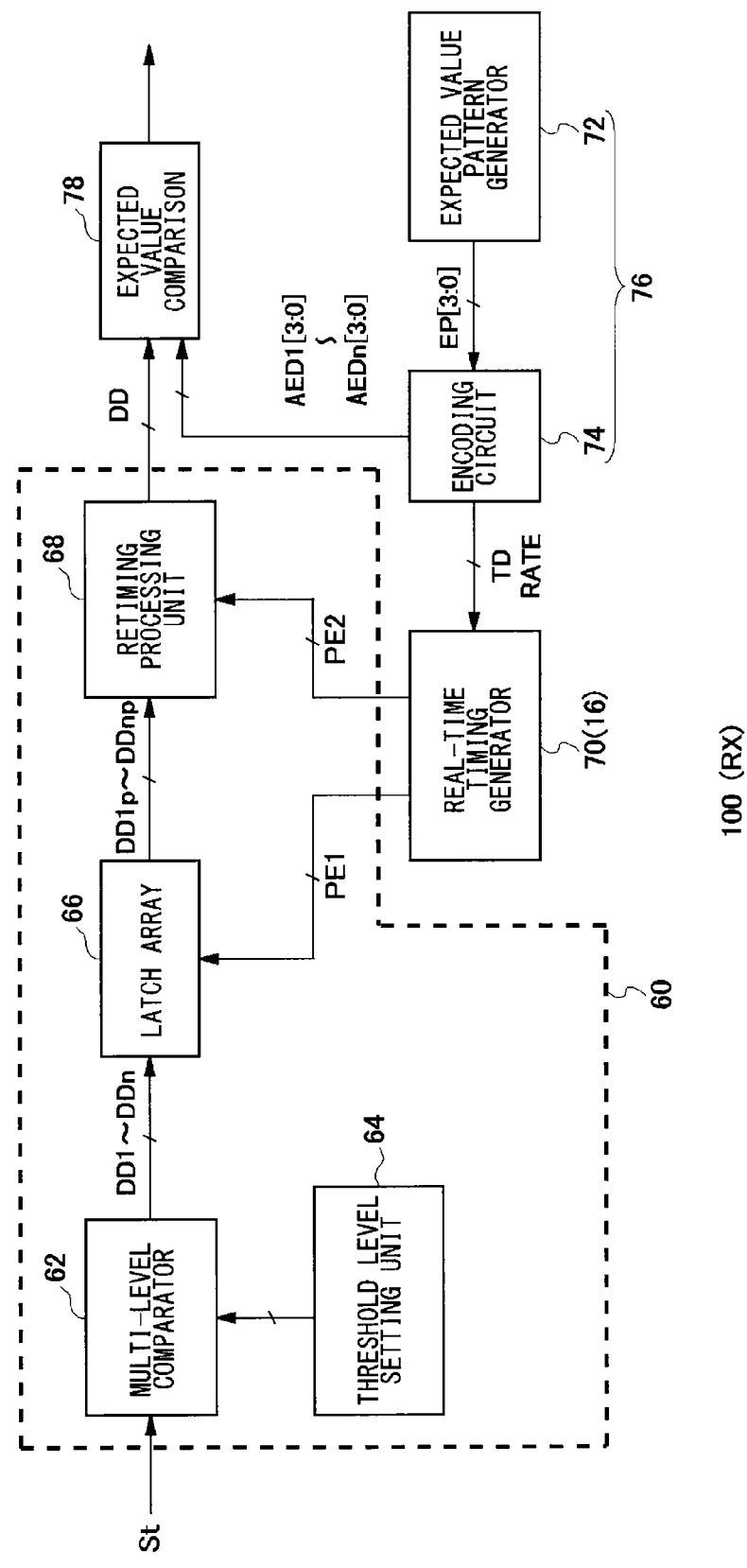
FIG. 10 is a block diagram which shows a reception circuit including a digital demodulator according to a second embodiment.

FIG. 10 is a block diagram which shows a configuration of a reception circuit including a digital demodulator 60 according to a second embodiment. The reception circuit tests a digital multi-level modulated signal under test St received from the DUT 110.

The reception circuit of the test apparatus 100 includes a digital demodulator 60, a timing generator 70, an amplitude expected value data generator 76, and a judgment unit 78. The amplitude expected value data generator 76 and the judgment unit 78 shown in FIG. 10 correspond to the pattern generator 14 and the timing generator 16 shown in FIG. 1, respectively.

The amplitude expected value data generator 76 generates amplitude expected value data AED which represents a modulated signal waveform that corresponds to the expected value of the data to be output from the DUT 110 (which will be referred to as the "expected value data" hereafter).

First, description will be made regarding the amplitude expected value data AED. In the reception circuit, the modulated signal waveform is virtually quantized, in other words segmented, in the amplitude (level) direction. Furthermore, the modulated signal waveform thus quantized is sampled in the time-axis direction at a predetermined sampling rate. The number of amplitude segments may be determined as desired. However, seen from the point of view of the circuit scale, n is preferably is on the order of 10 or more, and, at most, is preferably set to 32 or less. Instead, the sampling rate is preferably set to be sufficiently higher than the carrier frequency, e.g., is preferably set to 16 times or 32 times the carrier frequency, or more.

The amplitude expected value data AED is data that represents, in increments of sampling points, which of the multiple amplitude segments SEG1 through SEGn the amplitude of the modulated signal waveform that corresponds to the expected value data belongs to.

The digital demodulator 60 samples the modulated test signal waveform St received from the DUT 110 at a predetermined sampling rate, and generates judgment data DD that represents, in increments of sampling points, which of the multiple amplitude segments SEG1 through SEGn the amplitude thus sampled belongs to.

The judgment unit 78 compares the amplitude expected value data AED with the judgment data DD in increments of sampling points.

The above is the overall configuration of the reception circuit. It should be noted that there is a significant difference between the processing provided by the reception circuit according to the embodiment and conventional techniques in which the baseband data is extracted by performing quadrature demodulation and the baseband data thus extracted is compared with the expected value. That is to say, instead of the quadrature demodulation, the modulated test signal is sampled at a coarse resolution in the amplitude direction and at a fine resolution in the time-axis direction, e.g., at a time resolution of several picoseconds, and judgment is made whether or not the modulated test signal thus sampled matches the amplitude expected value data. As a result, there is no need to perform processing for down-conversion of the carrier frequency so as to extract the I component and the Q component. Thus, such an arrangement does not require a high-frequency analog circuit, thereby providing full-digital signal processing.

Detailed description will be made below regarding an example configuration of the reception circuit.

The amplitude expected value data generator 76 includes an expected value pattern generator 72 and a encoding circuit 74.

The expected value pattern generator 72 generates an expected value pattern EP which represents the expected value data for the data output from the DUT 110. The expected value pattern EP is data which corresponds to one symbol. In a case in which 16-QAM is employed, the expected value pattern EP is configured as 4-bit data. The number of bits of the expected value pattern EP is set according to the modulation method.

The encoding circuit 74 encodes the expected value pattern EP[3:0]. The encoding processing is executed as follows.

1. The modulated signal waveform that corresponds to the expected value pattern EP is quantized in increments of sampling points. The quantization processing is provided as virtual processing. That is to say, the encoding circuit 74 does not generate the modulated signal waveform.

2. The encoding circuit 74 generates the amplitude expected value data AED that represents, in increments of sampling points, which of the multiple amplitude segments SEG1 through SEGn the amplitude level of the modulated signal waveform belongs to.

The encoding processing may be performed by reading out, from memory, the amplitude expected value data AED prepared beforehand for each value of the expected value pattern EP. Alternatively, the encoding processing may be performed by numerical computation processing.

The digital demodulator 60 converts the signal to be tested St into a signal format that can be compared with the amplitude expected value data AED. In the present specification, such processing is referred to as "demodulation". That is to say, in the present specification, "demodulation" does not represent typical demodulation processing for extracting a baseband signal by means of frequency mixing.

The digital demodulator 60 includes a multi-level comparator 62, a threshold level setting unit 64, a latch array 66, and a retiming processing unit 68.

The multi-level comparator 62 compares the signal to be tested St with multiple threshold values that correspond to the respective amplitude segments SEG1 through SEGn so as to generate multiple judgment data DD1 through DDn. The i-th (i represents an integer) judgment data DDi is data which represents whether or not the signal to be tested St is within the i-th amplitude segment SEGi.

The threshold level setting unit 64 sets the threshold levels for the multi-level comparator 62 according to the number of amplitude segments n, the voltage range of the input signal to be tested St, and the digital modulation method.

The latch array 66 latches, at predetermined sampling timings, the judgment data DD1 through DDn output from the multi-level comparator 62 in increments of the amplitude segments SEG1 through SEGn. The sampling rate is set to be sufficiently higher than the carrier frequency (or symbol rate) of the signal to be tested. The latch array 66 performs, at a predetermined rate, serial/parallel conversion of the data DD1 through DDn thus latched at the sampling rate. The predetermined rate may be equal to the symbol rate, may be set to an integral multiple of the symbol rate, or may be set to an integral reciprocal of the symbol rate. The judgment data thus obtained in the form of parallel data will be represented by DD1p through DDnp.

The retiming processing unit 68 performs retiming processing of the judgment data DD1p through DDnp in order to provide synchronization with the judgment unit 78 provided as a downstream component such that the timing of the judgment data DD1p through DDnp matches the rate of the amplitude expected value data AED.

Figure 11:
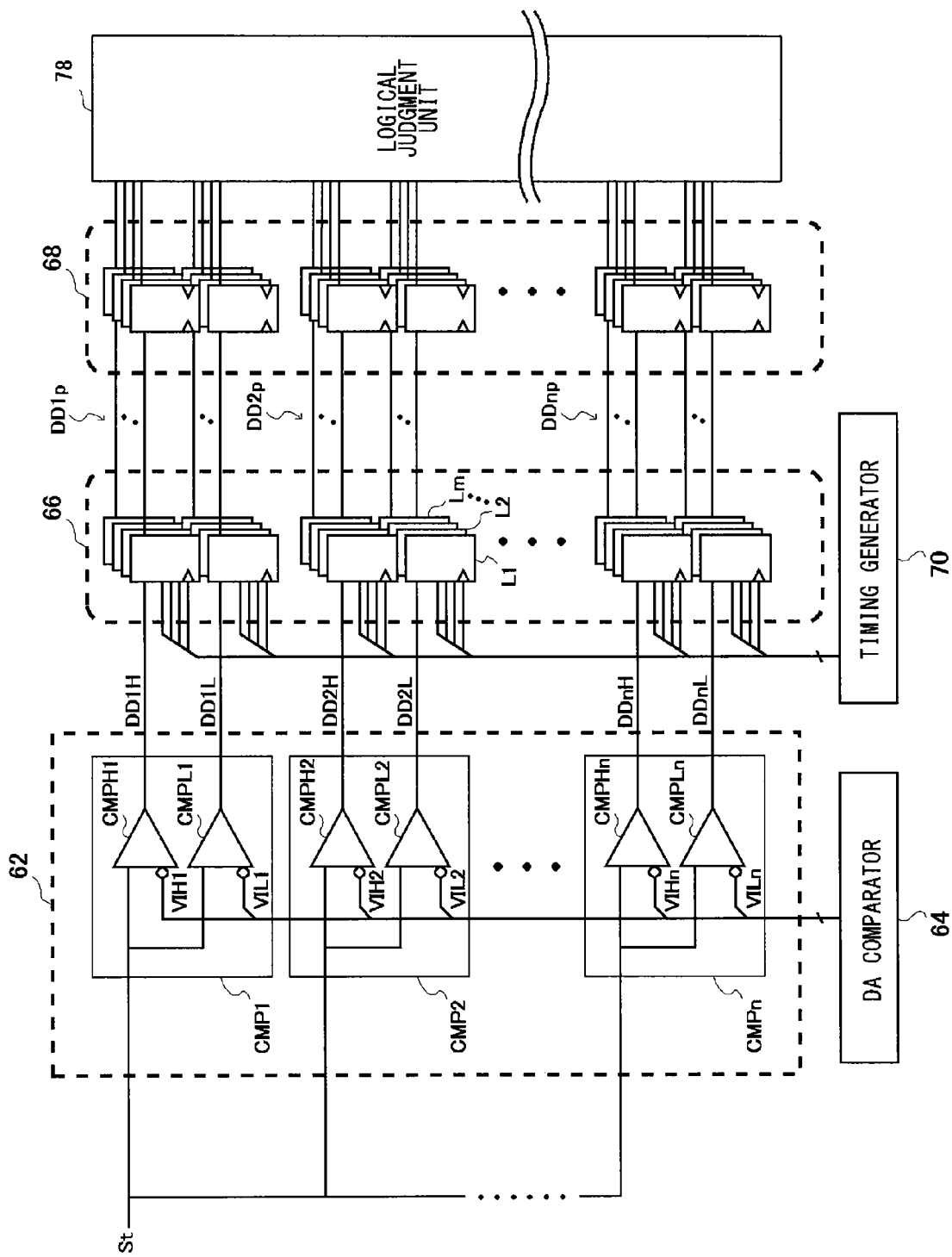
FIG. 11 is a circuit diagram which shows a specific example configuration of the digital demodulator shown in FIG. 10.

FIG. 11 is a circuit diagram which shows a specific example configuration of the digital demodulator 60 shown in FIG. 10.

The multi-level comparator 62 includes multiple window comparators CMP1 through CMPn provided in increments of segments. The i-th window comparator CMPi includes a high-side comparator CMPHi configured to compare the signal to be tested St with an upper threshold voltage VIHi and a low-side comparator CMPLi configured to compare the signal to be tested St with a lower threshold voltage VILi.

Thus, the judgment data DDi for the i-th segment is configured as 2-bit data comprising the output data DDiH of the high-side comparator CMPHi and the output data DDiL of the low-side comparator CMPLi.

The threshold level setting unit 64 is configured as a D/A converter, and generates threshold voltages to be supplied to the high-side comparators CMPH and the low-side comparators CMPL in increments of segments. The threshold levels for the multi-level comparator 62 are adjusted by means of the threshold level setting unit 64.

It should be noted that, in a case in which the upper threshold voltage VIH to be set for a given amplitude segment is equal to the lower threshold voltage VIL to be set for an adjacent amplitude segment, the upper threshold voltage VIH and the lower threshold voltage VIL can share the same voltage.

The latch array 66 functions as a demultiplexer or a serial/parallel conversion circuit, and comprises multiple latch circuits L1 through Lm for each of the comparators CMPH and CMPL. The number m may be equal to the number of sampling points set for each symbol. The multiple latch circuits L1 through Lm receive, as input signals, the output signals of the corresponding comparator CMPH (or CMPL). The i-th latch circuit Li latches the output signal of the corresponding comparator at the i-th sampling timing within the symbol period. That is to say, the multiple latch circuits L1 through Lm receive, as input signals, via the clock terminals thereof, multiple pulse edge sequences having phase delays that correspond to the sampling interval.

The latch array 66 generates the judgment data DD1p through DDnp in the form of parallel data.

The retiming processing unit 68 may include multiple FIFOs (First In/First Outs) provided in increments of latch circuits. The judgment data DD thus subjected to retiming by the retiming processing unit 68 is supplied to the judgment unit 78 provided as a downstream component. The judgment unit 78 performs logical judgment by comparing the judgment data DD thus received with the amplitude expected value data AED.

Returning to FIG. 10, the encoding circuit 74 outputs timing data TD which indicates the time intervals between the sampling points, in addition to the amplitude expected value data AED. The timing generator 70 generates a first pulse edge sequence PE1 having intervals that correspond to the timing data TD. The first pulse edge sequence PE1 is supplied to the clock terminals of the latch circuits L1 through Lm shown in FIG. 11. The timing generator 70 is configured such that it is capable of adjusting the frequency of the first pulse edge sequence PE1 and the timing of each edge as desired.

The encoding circuit 74 outputs rate setting data RATE which represents the rate of the amplitude expected value data AED. The timing generator 70 receives the rate setting data RATE, and generates a second pulse edge sequence PE2 having a frequency that corresponds to the value of the rate setting data RATE. The retiming processing unit 68 synchronizes the multiple judgment data DD1p through DDn received from the latch array 66 with the timing of the second pulse edge sequence PE2.

The above is the configuration of the reception circuit of the test apparatus 100. Next, description will be made regarding the operation of the test apparatus 100.

Figure 12:
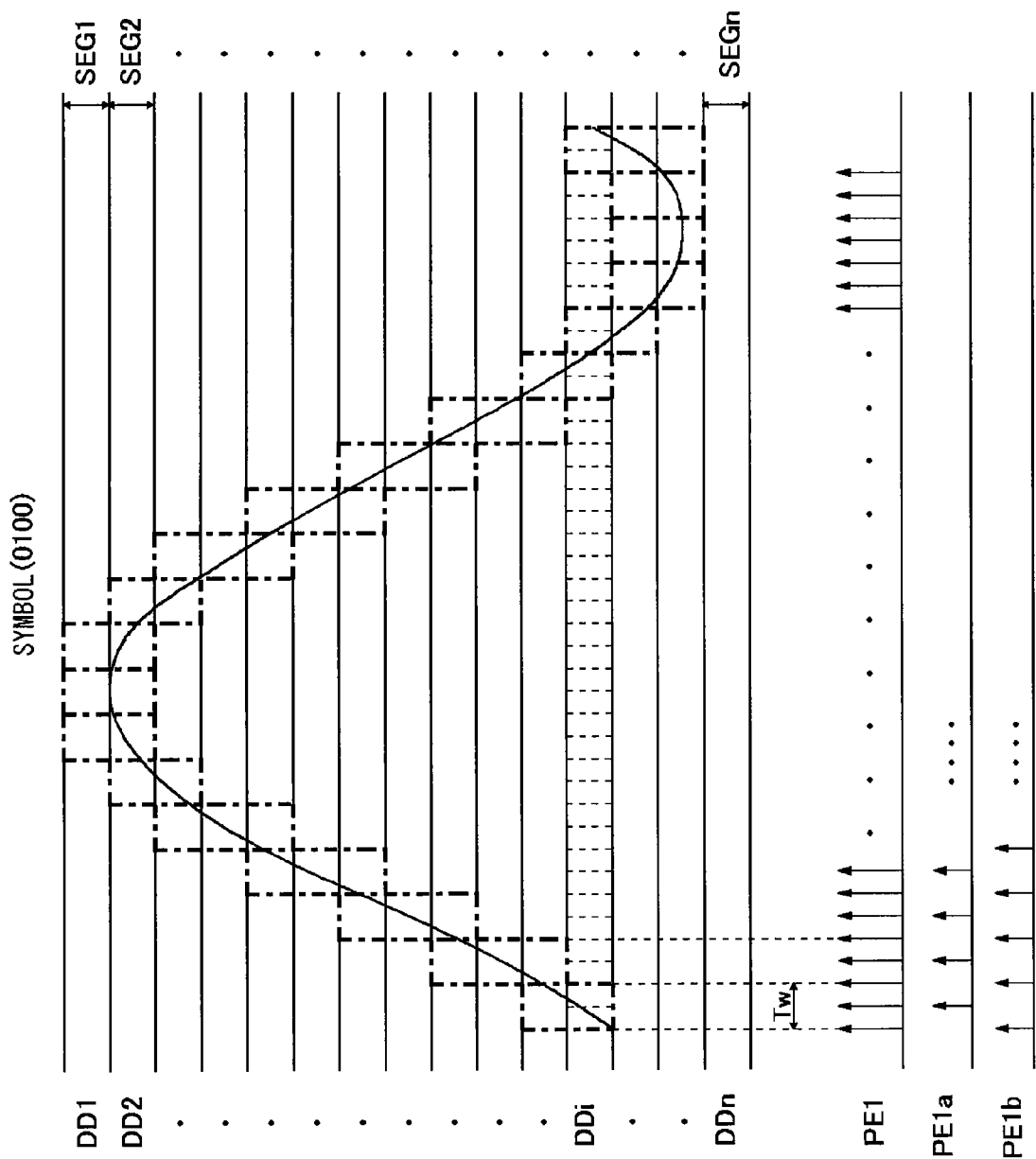
FIG. 12 is a conceptual diagram which shows comparison processing performed by a judgment unit in which amplitude expected value data is compared with judgment data.

FIG. 12 is a diagram showing the conceptual basis of the comparison processing in which the judgment data DD is compared with the amplitude expected value data AED. In FIG. 12, the signal to be tested St is indicated by the solid line. The amplitude is divided into multiple segments SEG1 through SEGn.

Judgment data DD is generated for each segment SEG. The i-th judgment data DDi represents whether or not the signal to be tested St is within the i-th segment SEGi at the respective edge timings of the pulse edge PE1.

The lines of dashes and dots indicate the respective windows that correspond to the modulated signal waveform of an expected symbol, and are defined by the amplitude expected value data AED. In the case of 16-QAM, the encoding circuit 74 outputs amplitude expected value data AED that defines windows corresponding to 16 symbols. The windows to be set for each symbol should be set based upon the modulation method, the encoding method such as Gray coding, the expected amplitude error, and the expected phase error, etc.

The judgment unit 78 compares the amplitude expected data AED that defines the windows with the judgment data DD1 through DDn. As a result, such an arrangement is capable of judging whether or not the symbol of the signal to be tested St matches the expected value.

For example, the amplitude expected value data may be provided as matrix-type data configured such that the rows correspond to the respective amplitude segments and the columns correspond to the respective sampling timings. With such matrix-type data, when the data is within the corresponding window, "1" may be stored as data of the matrix, and otherwise "0" is stored as the data of the matrix. In the same way, the multiple judgment data DD1 through DDn each include multiple data in the form of columns that correspond to the sampling timings. That is to say, the overall judgment data DD may be configured as matrix-type data. With such an arrangement, by comparing the respective bits of the matrix-type amplitude expected value data AED with the corresponding bits of the matrix-type judgment data DD, pass/fail judgment can be made.

As indicated by the pulse edge PE1a, a sampling timing may be set in the middle of the time width Tw of each window. Alternatively, as indicated by the pulse edge PE1b, sampling timings may be set at both edges of each window. In this case, such an arrangement literally provides a window test. Also, as indicated by PE1, the frequency of the pulse edges may be set as high as possible so as to digitize the signal to be tested St with high precision.

The above is the operation of the test apparatus 100.

Also, the following modification may be considered as a reception circuit of the test apparatus 100 according to the present embodiment.

[First Modification]

The latch array 66 changes the timings at which the judgment data DD1 through DDn are to be latched, according to the value of the amplitude expected value data AED. The latch array 66 shown in FIG. 11 includes single or multiple latch circuits for each of the comparators CMPH and CMPL.

Specifically, the following processing may be performed.

1. The windows shown in FIG. 12 are defined based upon the modulated signal waveform that corresponds to the expected value pattern EP.

2. The judgment data DD for the segments surrounded by the respective windows are latched at pulse edges that correspond to the windows.

That is to say, the judgment data DDi that corresponds to the i-th segment SEGi is latched at a timing at which the judgment data DDi is to include the modulated signal waveform. In a case in which all the judgment data thus latched indicate the values that include the modulated signal, it means that the windows include the modulated signal waveform, and thus a pass judgment is made. That is to say, the judgment data DD itself functions as data which represents the result of a comparison with the expected value. Thus, the comparison processing performed by the judgment unit 78 can be eliminated or simplified. Furthermore, with such a modification, there is no need to latch all the judgment data at the same timing. Thus, the latch array can be configured in a simple manner.

[Second Modification]

The multi-level comparator 62 changes the values of the threshold voltages VIH and VIL. The latch array 66 shown in FIG. 11 includes a single latch circuit or multiple latch circuits for each of the comparators CMPH and CMPL. The latches Li that correspond to the i-th comparators CMPHi and CMPLi each receive an edge of the i-th sampling timing defined within the symbol.

The threshold voltages VIHi and VILi for the i-th comparators CMPHi and CMPLi are set as follows.

1. The windows shown in FIG. 12 are defined based upon the modulated signal waveform that corresponds to the expected value pattern EP.

2. The upper limit level of the window that corresponds to the timing of the i-th edge is set to the threshold voltage VIHi, and the lower limit level of this window is set to the threshold voltage VILi.

With the second modification, in a case in which all the judgment data thus latched exhibit values that encompass the modulated signal, it means that the modulated signal waveform is within the windows. Thus, in this case, pass judgment is made. That is to say, the judgment data DD itself functions as data which represents the result of a comparison with the expected value. Thus, the comparison processing performed by the judgment unit 78 can be eliminated or simplified. Furthermore, with such a modification, there is no need to latch all the judgment data at the same timing. Thus, the latch array can be configured in a simple manner.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Figure 13:
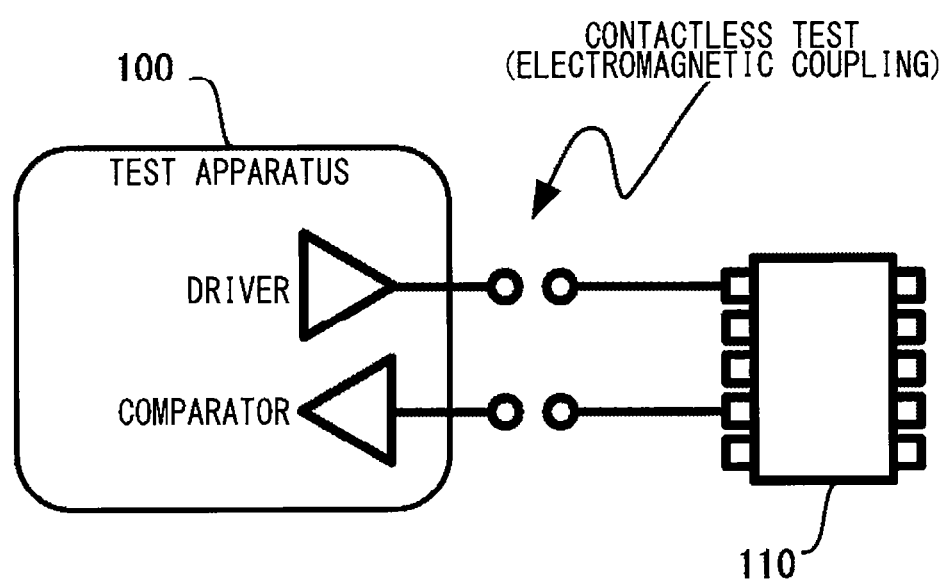
FIG. 13 is a block diagram which shows an example of a connection configuration for connecting the test apparatus and a DUT.

Description has been made in the embodiment regarding an arrangement in which the test apparatus 100 is connected to the DUT 110 via a signal line. However, the present invention is not restricted to such an arrangement. Also, contactless testing can be made by means of capacitance coupling or inductive coupling as shown in FIG. 13. For example, in a case in which a carrier modulated signal is transmitted and received between the test apparatus 100 and the DUT 110, the DC component of the carrier modulated signal is negligibly small. Thus, the test apparatus 100 can be connected to the DUT 110 by means of AC coupling.

The present invention discloses the following technical concepts in addition to the technical scope described in the appended claims.

Another embodiment of the present invention relates to a test apparatus configured to supply, to a device under test, a test signal subjected to digital multi-level modulation. The test apparatus comprises: a pattern generator configured to generate test data to be transmitted; an encoding circuit configured to generate, in a parallel manner, data which represents a modulated signal waveform that corresponds to the test data in the form of multiple amplitude data in increments of multiple sampling points set within a predetermined period for cycles of the predetermined period; a data rate setting unit configured to receive the multiple amplitude data generated by the encoding circuit, to latch the amplitude data at corresponding sampling timings, and to sequentially output the amplitude data; and a multi-level driver configured to receive the amplitude data sequentially output from the data rate setting unit, and to generate a test signal having a level that correspond to the value of the amplitude data.

Typical test apparatuses each mount a pattern generator which is capable of generating a desired pattern signal, and a timing generator which is capable of generating a timing signal having a desired frequency and desired phase properties. Thus, by providing an encoding circuit, a data rate setting unit, and a multi-level driver, in addition to such an architecture, such an arrangement is capable of supplying data subjected to digital multi-level modulation to a device under test without an increase of the scale of the hardware configuration. Such an embodiment is capable of directly generating a modulated signal in a desired modulation format, instead of using the quadrature modulation method in which an in-phase carrier signal and a quadrature carrier signal are combined by amplitude modulation.

Also, the encoding circuit may be configured to output timing data which indicates time intervals between the sampling points in addition to the amplitude data. Also, the data rate setting unit may be configured to latch the amplitude data in increments of sampling timings that correspond to the values of the timing data.

Such an arrangement is capable of setting the sampling rate as desired.

Also, a test apparatus according to an embodiment may further comprise a timing generator configured to receive the timing data, and to generate multiple pulse edge sequences each having a period set to the aforementioned predetermined period and each having a phase delay that corresponds to the timing data. Also, the data rate setting unit may use the pulse edge sequences output from the timing generator to latch each amplitude data.

Also, the timing generator may be configured such that the frequency of the pulse edge sequences and the timing of each edge are adjustable as desired.

With such an arrangement, desired jitter can be applied to the carrier frequency, thereby supporting various kinds of tests.

Also, the multi-level driver may be configured such that the output level thereof is adjustable.

By configuring the multi-level driver such that the output level thereof is adjustable, such an arrangement supports various kinds of digital multi-level modulation methods. Furthermore, such an arrangement is capable of applying desired error to the test signal (modulated signal). Alternatively, by applying pre-distortion to the test signal, such an arrangement is capable of calibrating non-linear distortion that occurs in a downstream block.

Also, the multi-level driver may be an M-level ($M=2^N$) driver configured to receive N-bit (N represents an integer) amplitude data in the form of differential data, and may comprise N differential amplifiers. Also, each differential amplifier may comprise: a differential pair configured to receive each bit of the amplitude data as input data in the form of differential data; a tail current source configured to bias the differential pair; and an output load circuit arranged for the differential pair. Also, the output load circuits for the N differential amplifiers may be configured as a shared output load circuit. Also, tail currents generated by the tail current sources provided to the N differential amplifiers may be configured such that they can be controlled independently.

Also, a test apparatus according to an embodiment may further comprise a filter configured to perform filtering of the output signal of the multi-level driver. By providing a filter, such an arrangement can adjust the quantized waveform such that it approaches a smooth ideal waveform.

Also, the aforementioned predetermined period may be an integral multiple or an integral reciprocal of the time of one symbol.

Also, the aforementioned predetermined period may be an integral multiple or an integral reciprocal of the period of a carrier signal.

Another embodiment of the present invention relates to a modulator configured to generate a modulated signal subjected to digital multi-level modulation. The modulator comprises: an encoding circuit configured to generate, in a parallel manner, data which represents a modulated signal waveform that corresponds to data to be transmitted, in the form of multiple amplitude data in increments of multiple sampling points set within a predetermined period, for cycles of the predetermined period; a data rate setting unit configured to receive the multiple amplitude data generated by the encoding circuit, to latch the amplitude data at corresponding sampling timings, and to sequentially output the amplitude data thus latched; and a multi-level driver configured to receive the amplitude data thus sequentially output from the data rate setting unit, and to generate a modulated signal having a level that corresponds to the value of the amplitude data.

By using the architecture of the timing generator mounted on the test apparatus, such an embodiment is capable of generating data subjected to digital multi-level modulation without an increase in the scale of the hardware configuration. Such an embodiment is capable of directly generating a modulated signal in a desired modulation format, instead of using the quadrature modulation method in which an in-phase carrier signal and a quadrature carrier signal are combined by amplitude modulation.

Yet another embodiment of the present invention relates to a semiconductor apparatus. The semiconductor apparatus comprises: a function device having multiple input/output ports; and the aforementioned multiple modulators, configured to perform digital modulation of data output from the input/output port of the function device, and to output resulting data to an external circuit.

Yet another embodiment of the present invention relates to a modulation method for generating a modulated signal subjected to digital multi-level modulation. The modulation method comprises: generating data to be transmitted; generating, in a parallel manner, data which represents a modulated signal waveform that corresponds to the data to be transmitted, in the form of multiple amplitude data in increments of multiple sampling points set within a predetermined period, for cycles of the predetermined period; latching the multiple amplitude data at corresponding sampling timings so as to convert the amplitude data thus latched into serial data; and generating a modulated signal having a level that corresponds to the value of the amplitude data thus provided in the form of serial data.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

The invention claimed is:

1. A test apparatus configured to test a digital modulated signal output from a device under test, the test apparatus comprising:
   an amplitude expected value data generator configured to generate amplitude expected value data in each symbol period, wherein the amplitude expected value data defines windows that correspond to an expected symbol, and the windows represent, in increments of sampling points in the symbol period, which of a plurality of amplitude segments the amplitude of a digital modulated signal waveform that corresponds to the expected symbol should belong to;
   a demodulator configured to perform sampling of a waveform of the digital modulated signal output from the device under test and to generate judgment data that represents, in increments of sampling points, which of the plurality of amplitude segments the amplitude of the digital modulated signal waveform output from the device under test belongs to; and
   a judgment unit configured to make a comparison between the amplitude expected value data and the judgment data in increments of sampling points, to judge whether or not the waveform of the digital modulated signal from the device under test corresponds to the expected symbol.

2. A test apparatus configured to test a signal to be tested, which has been subjected to digital multi-level modulation, output from a device under test, the test apparatus comprising:
   an amplitude expected value data generator configured to generate amplitude expected value data that represents, in increments of sampling points, which of a plurality of amplitude segments the amplitude of a modulated signal waveform that corresponds to the expected value of data to be output from the device under test belongs to;
   a demodulator configured to perform sampling of the waveform of the signal to be tested output from the device under test, and to generate judgment data that represents, in increments of sampling points, which of the plurality of amplitude segments the amplitude of the signal waveform to be tested belongs to; and
   a judgment unit configured to make a comparison between the amplitude expected value data and the judgment data in increments of sampling points,
   wherein the amplitude expected value data generator comprises:
   an expected value pattern generator configured to generate an expected value pattern that represents the expected value of data to be output from the device under test; and
   an encoding circuit configured to encode the expected value pattern to amplitude expected value data that represents, in increments of sampling points, which of a plurality of amplitude segments the amplitude of the corresponding modulated signal waveform belongs to.

3. A test apparatus configured to test a signal to be tested, which has been subjected to digital multi-level modulation, output from a device under test, the test apparatus comprising:
   an amplitude expected value data generator configured to generate amplitude expected value data that represents, in increments of sampling points, which of a plurality of amplitude segments the amplitude of a modulated signal waveform that corresponds to the expected value of data to be output from the device under test belongs to;
   a demodulator configured to perform sampling of the waveform of the signal to be tested output from the device under test, and to generate judgment data that represents, in increments of sampling points, which of the plurality of amplitude segments the amplitude of the signal waveform to be tested belongs to; and
   a judgment unit configured to make a comparison between the amplitude expected value data and the judgment data in increments of sampling points,
   wherein the demodulator comprises:
   a multi-level comparator configured to compare the signal to be tested with a plurality of threshold values that correspond to the respective amplitude segments so as to generate a plurality of judgment data; and
   a latch array configured to latch the plurality of judgment data output from the multi-level comparator at predetermined sampling timings.

4. A test apparatus according to claim 3, wherein the demodulator further comprises a retiming processing unit configured to synchronize the plurality of judgment data latched by the latch array with the amplitude value expected data in increments of sampling points.

5. A test apparatus according to claim 3, wherein the multi-level comparator is configured such that the threshold level thereof is adjustable.

6. A test apparatus configured to test a signal to be tested, which has been subjected to digital multi-level modulation, output from a device under test, the test apparatus comprising:
   an amplitude expected value data generator configured to generate amplitude expected value data that represents, in increments of sampling points, which of a plurality of amplitude segments the amplitude of a modulated signal waveform that corresponds to the expected value of data to be output from the device under test belongs to;
   a demodulator configured to perform sampling of the waveform of the signal to be tested output from the device under test, and to generate judgment data that represents, in increments of sampling points, which of the plurality of amplitude segments the amplitude of the signal waveform to be tested belongs to; and
   a judgment unit configured to make a comparison between the amplitude expected value data and the judgment data in increments of sampling points, wherein the amplitude expected value data generator comprises:

an expected value pattern generator configured to generate an expected value pattern that represents the expected value of data to be output from the device under test; and an encoding circuit configured to encode the expected value pattern to amplitude expected value data that represents, in increments of sampling points, which of a plurality of amplitude segments the amplitude of the corresponding modulated signal waveform belongs to, and to output timing data that represents time intervals between the sampling points, and wherein the demodulator comprises:

a multi-level comparator configured to compare the signal to be tested with a plurality of threshold values that correspond to the respective amplitude segments so as to generate the plurality of judgment data; and a latch array configured to latch the plurality of judgment data output from the multi-level comparator at sampling timings that correspond to the value of the timing data.

7. A test apparatus according to claim 6, further comprising a timing generator configured to receive the timing data, and to generate a first pulse edge sequence having intervals that correspond to the timing data thus received, wherein the latch array latches each judgment data using the first pulse edge sequence received from the timing generator.

8. A test apparatus according to claim 7, wherein the timing generator is configured such that the frequency of the first pulse edge sequence and the timing of each edge are adjustable as desired.

9. A test apparatus configured to test a signal to be tested, which has been subjected to digital multi-level modulation, output from a device under test, the test apparatus comprising:

an amplitude expected value data generator configured to generate amplitude expected value data that represents, in increments of sampling points, which of a plurality of amplitude segments the amplitude of a modulated signal waveform that corresponds to the expected value of data to be output from the device under test belongs to;

a demodulator configured to perform sampling of the waveform of the signal to be tested output from the device under test, and to generate judgment data that represents, in increments of sampling points, which of the plurality of amplitude segments the amplitude of the signal waveform to be tested belongs to; and a judgment unit configured to make a comparison between the amplitude expected value data and the judgment data in increments of sampling points, wherein the amplitude expected value data generator comprises:

an expected value pattern generator configured to generate an expected value pattern that represents the expected value of data to be output from the device under test; and an encoding circuit configured to encode the expected value pattern to expected value data that represents, in increments of sampling points, which of a plurality of amplitude segments the amplitude of the corresponding modulated signal waveform belongs to, and to output rate setting data that represents the rate of the amplitude expected value data, and wherein the demodulator comprises:

a multi-level comparator configured to compare the signal to be tested with a plurality of threshold values that correspond to the respective amplitude segments so as to generate the plurality of judgment data;

a latch array configured to latch the plurality of judgment data output from the multi-level comparator at predetermined sampling timings; and a retiming processing unit configured to latch the plurality of judgment data latched by the latch array at timings that correspond to the rate setting data, such that the aforementioned plurality of judgment data latched by the latch array are synchronized with the amplitude expected value data in increments of sampling points.

10. A test apparatus according to claim 9, further comprising a timing generator configured to receive the rate setting data, and to generate a second pulse edge sequence having a frequency that corresponds to the rate setting data, wherein the retiming processing unit is configured to synchronize the plurality of judgment data received from the latch array with the second pulse edge sequence.

11. A test method for testing a digital modulated signal output from a device under test, the test method comprising:

generating amplitude expected value data in each symbol period, wherein the amplitude expected value data defines windows that correspond to an expected symbol, and the windows represent, in increments of sampling points in the symbol period, which of a plurality of amplitude segments the amplitude of a digital modulated signal waveform that corresponds to the expected symbol should belong to;

sampling the digital modulated signal to be tested that corresponds to data output from the device under test, and generating judgment data that represents, in increments of sampling points, which of the plurality of amplitude segments the amplitude of a digital modulated signal waveform output from the device under test belongs to; and comparing the amplitude expected value data with the judgment data in increments of sampling points to judge whether or not the waveform of the digital modulated signal from the device under test corresponds to the expected symbol.

* * * * *